United States Patent [19]

Matsumoto et al.

[11] Patent Number: 4,476,548
[45] Date of Patent: Oct. 9, 1984

[54] DYNAMIC TYPE MOS MEMORY DEVICE

[75] Inventors: Tetsurou Matsumoto, Koganei; Kazuhiko Kazigaya, Fuchu, both of Japan

[73] Assignee: Hitachi, Ltd., Tokyo, Japan

[21] Appl. No.: 386,067

[22] Filed: Jun. 7, 1982

[30] Foreign Application Priority Data

Jun. 24, 1981 [JP] Japan .................................. 56/96638

[51] Int. Cl.$^3$ .............................................. G11C 11/40
[52] U.S. Cl. ...................................... 365/233; 365/189
[58] Field of Search ............... 365/174, 182, 189, 230, 365/233

[56] References Cited

U.S. PATENT DOCUMENTS 4,419,739 12/1983 Blum .................................... 365/233

Primary Examiner—Terrell W. Fears
Attorney, Agent, or Firm—Antonelli, Terry & Wands

[57] ABSTRACT

A dynamic type MOS memory device comprises a plurality of word lines, selecting switch MOSFETs which are disposed in correspondence with the respective word lines, a control circuit for controlling the selecting switch MOSFETs, MOSFETs which are disposed between the respective word lines and the ground potential and which are used as resistance means, and an inverter circuit which receives timing signals to be applied to input side electrodes of the selecting switch MOSFETs and which supplies the MOSFETs as the resistance means with control signals for bringing these MOSFETs into "off" states.

The timing signal is brought into a supply voltage level substantially in synchronism with the completion of the operation of the control circuit.

Accordingly, a dynamic type MOS memory device whose operating speed has been rendered high can be provided.

3 Claims, 10 Drawing Figures

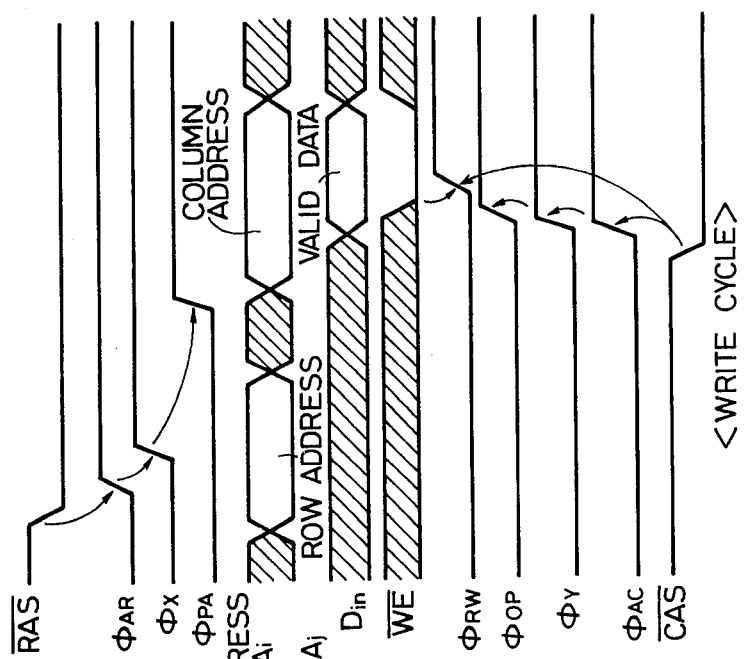
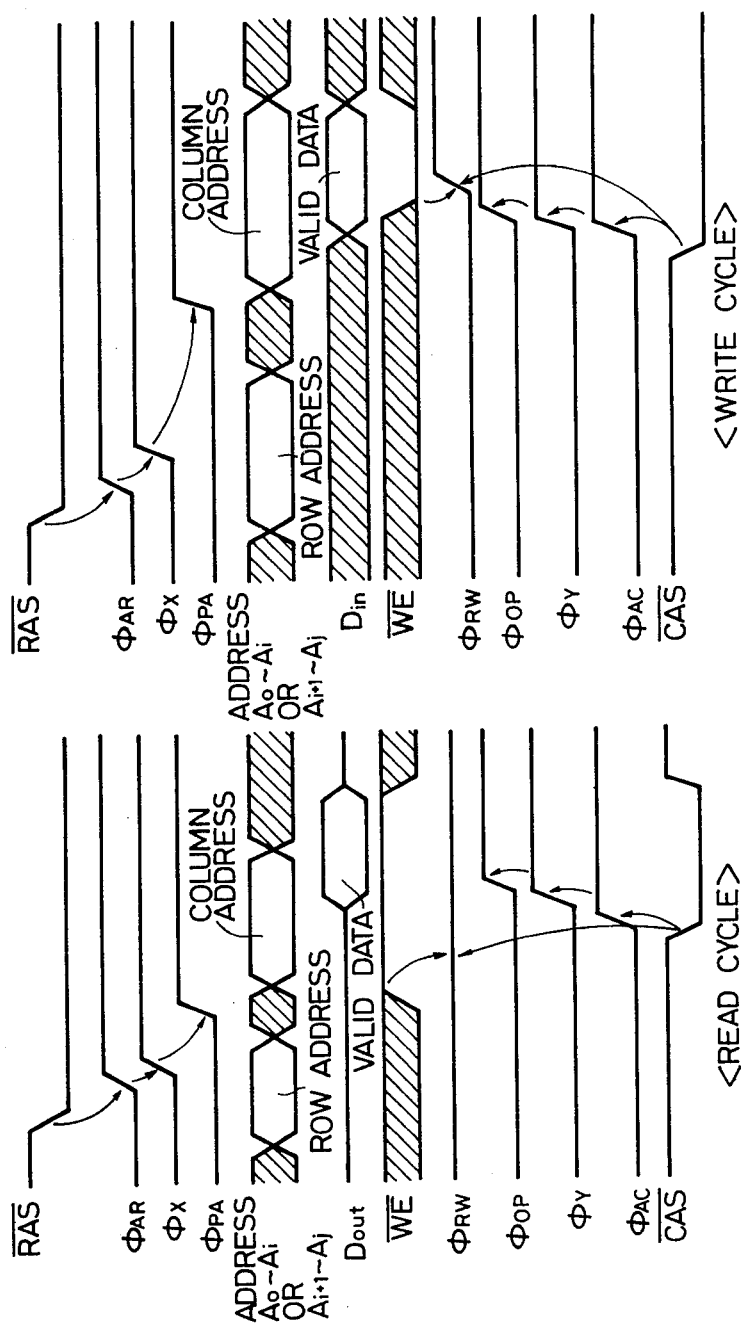

DYNAMIC TYPE MOS MEMORY DEVICE

BACKGROUND OF THE INVENTION

This invention relates to a dynamic type MOS (Metal-Oxide-Semiconductor) memory device.

In a dynamic type MOS memory device in which the operation of selecting a word line and a data line is performed in accordance with a predetermined timing signal, this timing signal is brought into, for example, a high level at the time when the operation of a corresponding address buffer circuit has ended and when it has become possible to select one word line and data line by means of an address decoder circuit. In response to the high level of the timing signal, the gates of word line-and data line-selecting switch MOSFETs which are to be selected by the address decoder circuit are brought into a selection level such as the high level.

The timing signal can be delivered from a suitable control circuit which is started by a signal such as a memory start signal.

In this case, however, notice must be taken of the following:

In such a case where the timing signal is generated in the state in which the output signal level of the address buffer circuit is undetermined, the gates of the word line-and data line-selecting switch MOSFETs are supplied with signals of undesired level at the time when the operation of the address decoder circuit has not ended. As a result, the gates of the selecting switch MOSFETs of word lines to be unselected and data lines to be unselected are brought into the selection level, and a plurality of memory cells are selected at the same time.

Accordingly, there are required timing signals of desirable timing which operate the circuitry normally irrespective of the dispersion of the characteristics of elements in the address buffer circuit or the address decoder circuit and the variation of the element characteristics ascribable to temperature changes, supply voltage fluctuations, etc.

In case of utilizing the control circuit of the address buffer circuit, the address decoder circuit etc. as described above, the timing signal is generated with a delay time which is sufficiently longer than the maximum delay time that is determined by the dispersion and variation of the element characteristics. However, this forms a serious hindrance when it is intended to operate the circuit at high speed.

SUMMARY OF THE INVENTION

It is accordingly an object of this invention to provide a dynamic type MOS memory device whose operation is rendered fast.

The dynamic type MOS memory device according to this invention comprises a plurality of word lines, selecting switch MOSFETs which are disposed in correspondence with the respective word lines, a control circuit which controls the selecting switch MOSFETs, a plurality of MOSFETs which are disposed between the respective word lines and a ground potential and which are used as resistance means, and an inverter circuit which receives timing signals applied to input side electrodes of the selecting switch MOSFETs and which supplies the MOSFETs as the resistance means with control signals for bringing these MOSFETs into off states.

The timing signal is brought into a supply voltage level substantially in synchronism with the end of the operation of the control circuit.

BRIEF DESCRIPTION OF THE DRAWINGS

FIGS. 3A and 3B are diagrams of operating waveforms in the memory device of FIG. 2, FIGS. 5A and 5B are practicable circuit diagrams of essential portions showing an embodiment of this invention.

DESCRIPTION OF THE PREFERRED EMBODIMENTS

Hereunder, this invention will be described in detail in conjunction with embodiments.

Arrangement and Operation of Dynamic Memory System

Figure 1:
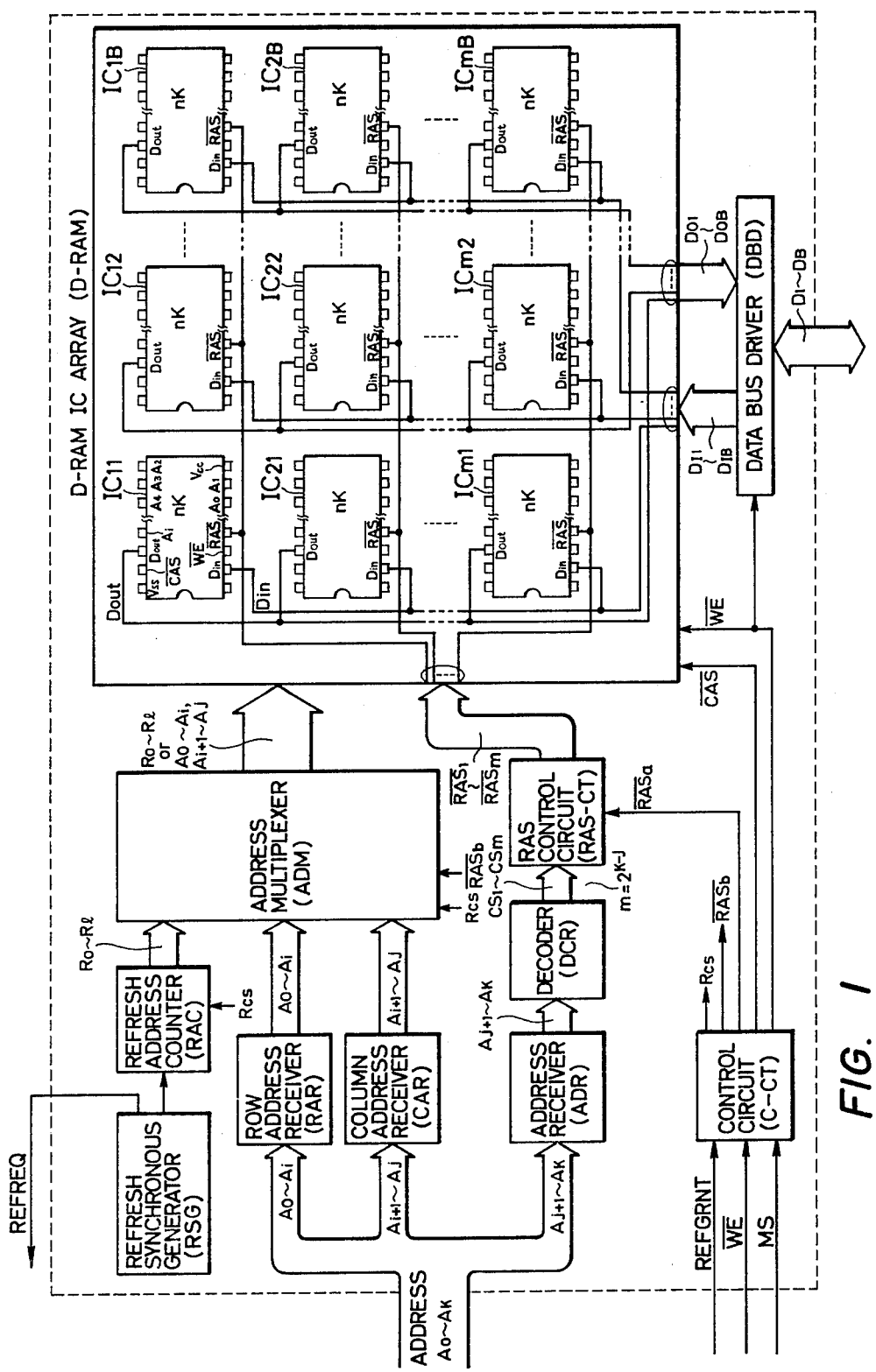
FIG. 1 is a block diagram of a dynamic type memory system showing an embodiment of this invention.

The arrangement of a dynamic memory system will be described with reference to FIG. 1. The figure shows a block diagram of the dynamic memory system. This system is constructed of a D-RAM IC ARRAY (hereinbelow, termed "D-RAM"), and interface circuits disposed between the D-RAM and a central processing unit (hereinbelow, termed "CPU", and not shown) in a computer.

The D-RAM is constructed of a plurality of integrated circuit (hereinbelow, abbreviated to "IC") chips IC11–ICmB each of which has a memory capacity of n kilobits. The IC chips are arrayed in m rows and B columns. Accordingly, the D-RAM has a capacity of (n×m) words×B bits.

The interface circuits are a row address receiver RAR, a column address receiver CAR, an address receiver ADR, a decoder DCR, a RAS control circuit RAS-CT, an address multiplexer ADM, a refresh synchronous generator RSG, a refresh address counter RAC, a data bus driver DBD and a control circuit C-CT.

The RAR receives address signals $A_0$–$A_i$ among address signals $A_0$–$A_k$ transmitted from the CPU, and converts them into the address signals of timings adapted for the operating timings of the D-RAM. The CAR receives address signals $A_{i+1}$–$A_j$ among the address signals $A_0$–$A_k$, and converts them into the address signals of timings adapted for the operating timings of the D-RAM.

The ADR receives address signals $A_{j+1}$–$A_k$ among the address signals $A_0$–$A_k$, and converts them into the address signals of timings adapted for the operating timings of the D-RAM.

The DCR delivers chip selection control signals $CS_1$–$CS_m$ (m = $2^{k-j}$) for selecting the IC chips within the D-RAM, in response to the address signals $A_{j+1}$–$A_k$ supplied from the address receiver ADR.

The RAS-CT delivers chip selection signals and row address introducing signals of timings adapted for the operating timings of the D-RAM.

The ADM multiplexes the address signals $A_0$–$A_i$ and $A_{i+1}$–$A_j$ in time sequence, and delivers them to the D-RAM.

The RSG is a circuit for determining the timings at which the memory information of the D-RAM are refreshed.

The RAC delivers refresh address signals $R_0$–$R_l$ for refreshing the memory information of the D-RAM.

The DBD is disposed between the CPU and the D-RAM, and controls a data bus by receiving a $\overline{WE}$ signal.

The C-CT delivers signals for controlling the aforementioned RAC, ADM, RAS-CT, DBD and D-RAM.

Signals which are applied from the CPU side to the interface circuits include the address signals $A_0$–$A_k$, a refresh grant signal REFGRNT, the write enable signal $\overline{WE}$, a memory start signal MS, etc. The address signals $A_0$–$A_k$ are signals for selecting addresses within the D-RAM. The refresh grant signal REFGRNT is a signal for refreshing the memory information within the D-RAM. The write enable signal $\overline{WE}$ is a read and write instruction signal for the data in the D-RAM. The memory start signal MS is a signal for starting the memory operation of the D-RAM. Input/output data $D_1$–$D_8$ are input/output data on the data bus which connects the CPU and the D-RAM. A refresh request signal REFREQ is a signal for requesting the refresh of the memory information within the D-RAM.

Now, the construction of the address signals within the dynamic memory system will be explained.

The address signals $A_0$–$A_k$ transmitted from the CPU (not shown are substantially divided into the two sorts of the address signals $A_0$–$A_j$ and the address signals $A_{j+1}$–$A_k$ within the dynamic memory system.

One sort of address signals $A_0$–$A_j$ are used as address signals which are applied to the address terminals of the respective IC chips within the D-RAM.

The other sort of address signals $A_{j+1}$–$A_k$ are processed into chip selection signals $\overline{RAS}_1$–$\overline{RAS}_m$ which are applied to the $\overline{RAS}$ terminals of the IC chips within the D-RAM.

The address signals $A_0$–$A_j$ are further divided into the two sorts of the address signals $A_0$–$A_i$ and $A_{i+1}$–$A_j$. The address signals $A_0$–$A_i$ among them are allotted to the row selection of the memory matrix array within the IC chip, while the address signals $A_{i+1}$–$A_j$ are allotted to the column selection of the memory matrix array.

Now, the operation of the dynamic memory system will be explained.

The address signals $A_0$–$A_j$ transmitted from the CPU are divided into $A_0$–$A_i$ and $A_{i+1}$–$A_j$, which are respectively applied to the ADM through the RAR and the CAR.

Thereafter, when a row address strobe signal $\overline{RAS}_b$ has become a certain level, the row address signals $A_0$–$A_i$ are delivered from the ADM. These row address signals $A_0$–$A_i$ are applied to the address terminals of the IC chips within the D-RAM. At this time, the ADM does not deliver the column address signals $A_{i+1}$–$A_j$ because it is put into a proper arrangement in advance.

Subsequently, when the $\overline{RAS}_b$ signal has become the opposite level to the aforementioned level, the column address signals $A_{i+1}$–$A_j$ are responsively delivered from the ADM and are similarly applied to the address terminals of the IC chips within the D-RAM. At this time, the row address signals $A_0$–$A_i$ are not delivered from the ADM.

Thus, the address signals $A_0$–$A_i$ and $A_{i+1}$–$A_j$ are applied to the address terminals of the IC chips within the D-RAM in time sequence in response to the levels of the $\overline{RAS}_b$ signal.

In case a refresh control signal $R_{cs}$ is not applied to the ADM and the RAC, the refresh address signals $R_0$–$R_l$ are not delivered from the ADM.

The chip selection signals $A_{j+1}$–$A_k$ are converted by the DCR into the chip selection control signals $CS_1$–$CS_m$ ($m=2^{k-j}$) which serve principally for selecting the IC chips within the D-RAM. The signals $CS_1$–$CS_m$ are converted by the RAS-CT into the $\overline{RAS}_1$–$\overline{RAS}_m$ signals with their delivery timings controlled. The $\overline{RAS}_1$–$\overline{RAS}_m$ signals are used as chip selecting signals and row address introducing signals. The $\overline{RAS}_1$ signal is supplied to the IC chips IC11–IC1B of the first row in the D-RAM in common. Likewise, the $\overline{RAS}_m$ signal is supplied to the IC chips ICm1–ICmB of the m-th row in common.

Now, the operation of setting the addresses in the IC chips of the D-RAM will be explained.

First, the row address signals $A_0$–$A_i$ are applied to the address terminals of all the IC chips of the D-RAM.

Thereafter, among the $\overline{RAS}_1$–$\overline{RAS}_m$ signal, only one signal, e.g., the $\overline{RAS}_1$ signal is brought into a certain level in accordance with a row address strobe signal $\overline{RAS}_a$ and the chip selection signals $A_{j+1}$–$A_k$. In response to the predetermined level of the $\overline{RAS}_1$ signal, the row address signals $A_0$–$A_i$ are introduced into the B IC chips IC11–IC1B of the first row in the D-RAM. The reason why the row address signals $A_0$–$A_i$ are applied to the IC chips before the $\overline{RAS}_1$ signal here, is that any other signals than the row address signals $A_1$–$A_i$ are prohibited from being introduced due to the application of the $\overline{RAS}_1$ signal before the row address signals $A_0$–$A_i$.

Subsequently, the column address signals $A_{i+1}$–$A_j$ are applied to the address terminals of all the IC chips of the D-RAM.

Thereafter, when the $\overline{CAS}$ signal delayed from the $\overline{RAS}_1$ has been brought into a certain level, the column address signals $A_{i+1}$–$A_j$ are responsively introduced into the B IC chips of the first row in the D-RAM. The reason why the column address signals $A_{i+1}$–$A_j$ are applied to the ICs before the $\overline{CAS}$ signal here, is the same as the aforementioned reason.

By the above operations, the addresses of memory cells to be selected within the B IC chips of the first row in the D-RAM are set.

Among the IC chips within the D-RAM, the IC chips of the rows except the first row are not selected because the $\overline{RAS}_2$–$\overline{RAS}_m$ signals are held at the opposite level to the level of $\overline{RAS}_1$ signal.

Next, the operation of writing data into the memory cells corresponding to the addresses set as described above is performed when the $\overline{WE}$ signal is at a predetermined level, for example, the low level.

The reading operation is performed when the $\overline{WE}$ signal is at the opposite level to the above.

The writing operation is carried out in such a way that input data DI1–DIB from the CPU are written into the B addressed memory cells. At this time, output data DO1–DOB from the D-RAM are controlled by the $\overline{WE}$ signal so as not to be delivered from the DBD.

The reading operation is carried out in such a way that the data DO1–DOB corresponding to the B addressed memory cells are read out from the ADM. At this time, the input data DI1–DIB are controlled by the $\overline{WE}$ signal so as not to be delivered from the DBD to the D-RAM.

Refresh Operation

In the memory cell circuit of the D-RAM, an information is stored in a capacitor, such as a MOS capacitor, in the form of charges. The charges decrease with time on account of a leakage current. Problematic here is that when a charge level corresponding to, e.g., an information "1" (high level) has become lower than a reference level for discriminating information "1" and "0" (low level) as the result of the charge leakage, it is erroneously discriminated as "0". In order to keep the information "1" stored, therefore, the charges need to be refreshed before they decrease below the reference level. The refresh operation needs must be executed at least once within the information storage time of the memory cell to be compensated.

Now, the refresh operation will be described with reference to FIG. 1.

The refresh synchronous generator RSG transmits the refresh request signal REFREQ to the CPU every period of (the information storage time) / (the number of refresh cycles). (The number of refresh cycles is equivalent to the number of word lines connected to a column data line.)

Upon receiving the REFREQ, the CPU transmits the refresh grant signal REFGRNT. Although not especially restricted, the CPU is so constructed as not to deliver the write enable signal $\overline{WE}$ and the memory start signal MS at this time. Upon receiving the REFGRNT, the control circuit C-CT provides the refresh control signal $R_{cs}$ which is to be applied to the address multiplexer ADM as well as the refresh address counter RAC. Upon receiving the $R_{cs}$ signal, the ADM supplies the D-RAM with the address signals $R_O$–$R_l$ exclusively for refresh use in place of the address signals $A_O$–$A_j$ for random access use.

Refreshing methods in the D-RAM are broadly classified into two. One of them is a method in which the respective rows of the IC chip array are successively refreshed. This method has the advantage that the power consumption required for the refresh is low, but it has the disadvantage that the period of time required for the refresh is long.

The other method is a method in which the whole IC chip array of the D-RAM is refreshed at the same time. An arrangement for executing this method is not shown in FIG. 1. For example, the address signals $A_{j+1}$–$A_k$ from the address receiver are applied to the RAS control circuit RAS-CT without passing through the decoder DCR, and all the output signals $\overline{RAS_1}$–$\overline{RAS_m}$ of the RAS-CT are brought into a certain level, thereby to select all the ICs of the D-RAM at the same time. Thus, the refresh is effected.

The advantage of this method is that the period of time required for the refresh is short, whereas the disadvantage is that the power consumption is high.

There will now be explained the refresh operation in the matrix array within the IC of the D-RAM.

The refresh address signals $R_O$–$R_l$ are applied from the ADM to the address terminals of the IC chips. Thereafter, the $\overline{RAS}$ signal becomes a certain level, and the $2^{l+1}$ row addresses of the IC matrix array are successively selected. At this time, the $\overline{CAS}$ signal lies at the opposite level to the above. The information of the memory cells connected to the selected row addresses are amplified by a sense amplifier (not shown) so that their level differences of "1" and "0" may be expanded. The amplified information are written into the memory cells again. That is, the refresh is performed.

The $\overline{WE}$ signal is not transmitted to the D-RAM and the DBD during the refresh operation. Therefore, no data is inputted from or outputted to the DBD.

Figure 2:
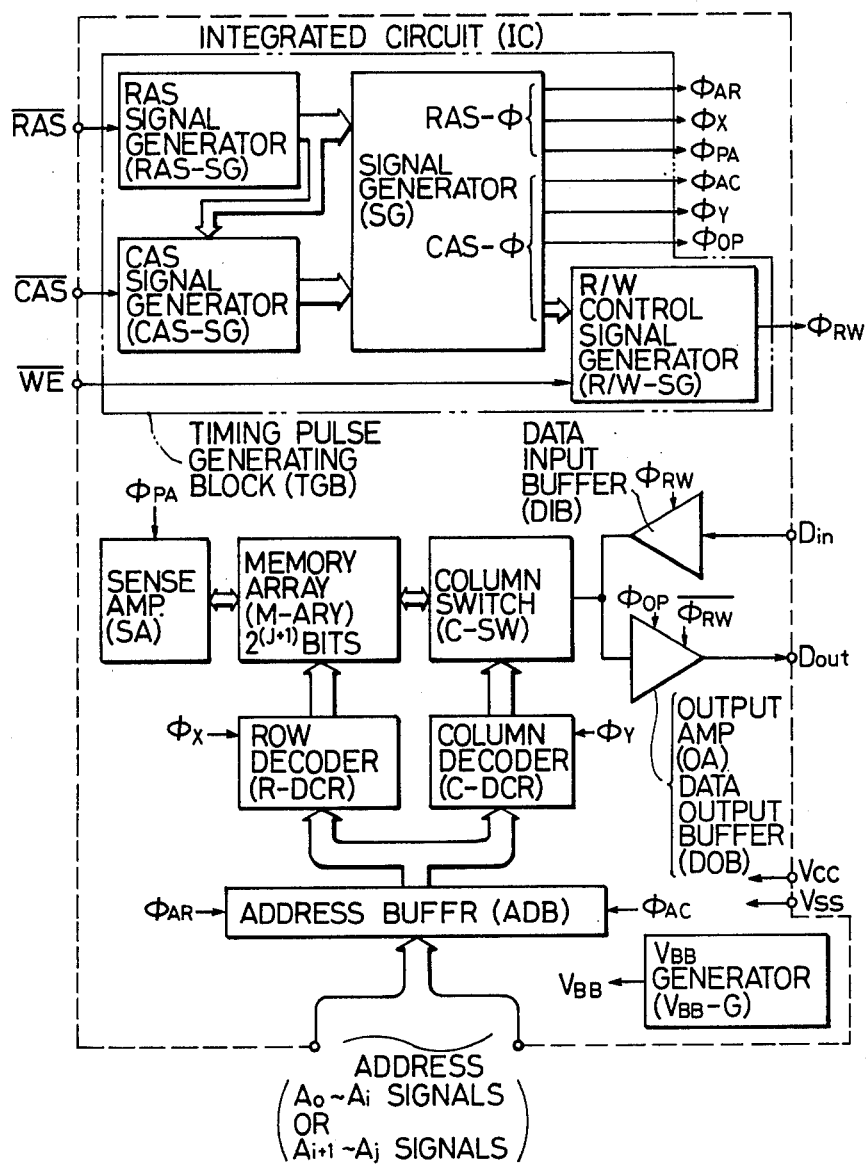
FIG. 2 is a block diagram of a dynamic type memory device showing an embodiment of this invention.
Figure 5A:
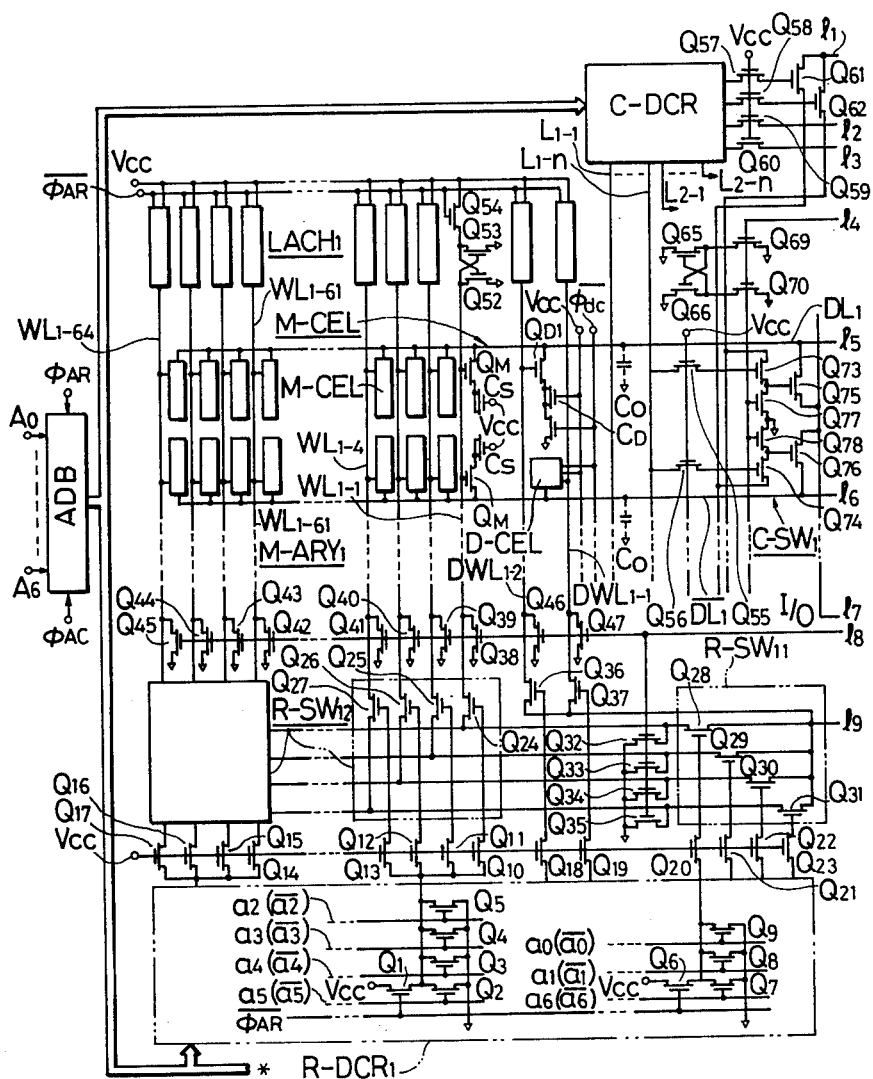
Figure 5B:
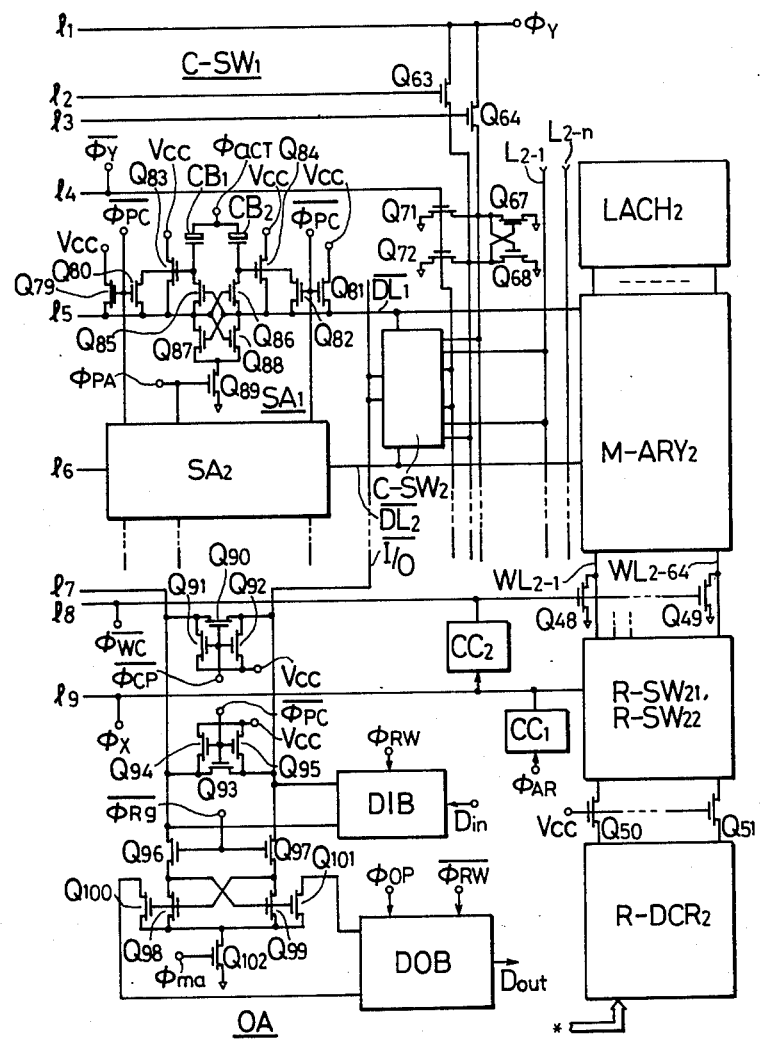

FIG. 2 shows the circuit block of one IC in the D-RAM, and FIGS. 5A and 5B show the more detailed circuit arrangement of the IC.

The circuit block of FIG. 2 is fed with supply voltages from a power source not shown, which includes a battery for ensuring an operation during the turn-off of a power switch, through the supply voltage receiving terminals $V_{cc}$ and $V_{ss}$ of the IC.

The IC in the figure is constructed of a timing pulse generating block TGB, a memory array M-ARY, a sense amplifier SA, a column switch circuit C-SW, a data input buffer DIB, a data output buffer DOB, a row decoder R-DCR, a column decoder C-DCR, an address buffer circuit ADB, and a substrate bias voltage generator $V_{BB}$-G.

The memory array M-ARY is known in itself, and the detailed description of the arrangement thereof is accordingly omitted. It is constructed of a plurality known memory cells which are arrayed in the shape of a matrix and each of which has the 1-MOS transistor cell structure. Among the plurality of memory cells arrayed into the matrix, the memory cells arranged in an identical column have their selection terminals coupled to one word line in common, and the memory cells arranged in an identical row have their data input/output terminals coupled to one data line in common. The word line forms the row line of the memory array, while the data line forms the column line of the memory array.

Further, as shown in the figure, the timing pulse generating block TGB is constructed of a RAS signal generator RAS-G which is operated by a row address strobe signal (hereinbelow, termed $\overline{RAS}$) supplied through the external terminal $\overline{RAS}$ of the IC, a CAS signal generator CAS-SG which is operated by a column address strobe signal (hereinbelow, termed $\overline{CAS}$) supplied through an external terminal $\overline{CAS}$ and a signal delivered from the circuit RAS-SG, a signal generator SG which is operated by signals delivered from the circuits RAS-SG and CAS-SG, and a read/write control signal generator R/W-SG which is operated by a signal delivered from the circuit SG and a write control signal (hereinbelow, termed $\overline{WE}$) supplied through an external terminal $\overline{WE}$.

The signal generator SG provides various signals responsive to the $\overline{RAS}$ signal (hereinbelow, termed RAS-group signals) and various signals responsive to the $\overline{CAS}$ signal (hereinbelow, termed CAS-group signals). The operations of the various circuits constructed of dynamic circuits are controlled by the RAS-group signals and the CAS-group signals.

The various signals in the RAS-group signals and the CAS-group signals are respectively set as follows by way of example:

(1) RAS-group Signals

The RAS-group signals consist of signals $\phi_{AR}$, $\phi_x$, $\phi_{PA}$ etc.

The $\phi_{AR}$ is an address buffer control signal which is supplied to the address buffer ADB. This control signal $\phi_{AR}$ is used as a signal for determining whether or not the row address signals supplied to and latched in the address buffer ADB are transmitted to the row and decoder R-DCR. Supposing that the row address signals supplied to the external terminals of the IC are those $A_0$–$A_i$, the address buffer ADB forms signals $a_0$, $\overline{a_0}$ to $a_i$, $\overline{a_i}$ of non-inverted and inverted levels which correspond to the address signals $A_0$–$A_i$ and which are set at the appropriate levels.

The $\phi_X$ is a word line control signal which is supplied to the row decoder R-DCR. This control signal $\phi_X$ is used as a signal for determining whether or not one signal formed by the row decoder R-DCR in order to select the row address of the memory array M-ARY is transmitted to the memory array M-ARY.

The $\phi_{PA}$ is a sense amplifier control signal, which is a signal applied to the sense amplifier SA and driving the sense amplifier SA.

(2) CAS-group Signals

The CAS-group signals consist of signals $\phi_{AC}$, $\phi_Y$, $\phi_{OP}$ etc.

The $\phi_{AC}$ is an address buffer control signal which is supplied to the address buffer ADB. This control signal $\phi_{AC}$ is used as a signal for determining whether or not the column address signals supplied to and latched in the address buffer ADB are transmitted to the column address decoder C-DCR. Supposing that the column address signals supplied to the external terminals are those $A_{i+1}$–$A_j$, the address buffer ADB forms, likewise to the above, signals $a_{i+1}$, $\overline{a_{i+1}}$ to $a_j$, $\overline{a_j}$ of non-inverted level and inverted level corresponding thereto.

The $\phi_Y$ is a column switch control signal which is supplied to the decoder C-DCR. This control signal $\phi_Y$ is used as a signal for determining whether or not a column switch selection signal formed by the column decoder C-DCR is supplied to the column switch circuit C-SW.

The $\phi_{OP}$ is a data output buffer and output amplifier-control signal. This is used as a signal which is applied to the data output buffer DOB and to an output amplifier OA disposed if necessary and which serves to transmit read-out data from the memory array M-ARY to an output data ($D_{out}$) terminal.

$\phi_{RW}$ indicates a data input buffer-control signal. This is used as a signal which is applied to the data input buffer DIB and which serves to transmit write-down data from an input data terminal $D_{in}$ to the M-ARY.

$\overline{\phi_{RW}}$ indicates a data output buffer-control signal. This is used as a signal which is applied to the data output buffer DOB and which serves to prevent the read-out data from being delivered to the data output ($D_{out}$) terminal $D_{out}$ during the writing operation.

FIGS. 3A and 3B are timing diagrams of the IC shown in FIG. 2.

Now, the operations of the respective circuits of the IC will be explained with reference to the timing diagrams of FIGS. 3A and 3B.

First, before the $\overline{RAS}$ signal is brought into the low level, the row address signals $A_0$–$A_i$ are supplied to the external terminals of the IC. These address signals are supplied to the address buffer ADB. When the $\overline{RAS}$ signal has been brought from the high level to the low level at a predetermined timing, the signal $\phi_{AR}$ properly delayed is responsively provided, and the row address signals $A_0$–$A_i$ are latched in the address buffer ADB. In addition, the row address signals $a_0$, $\overline{a_0}$ . . . and $a_i$, $\overline{a_i}$ formed by the address buffer ADB are transmitted to the row decoder R-DCR. The reason why the $\overline{RAS}$ signal is delayed with respect to the row address signals $A_0$–$A_i$ in this manner, is to reliably introduce the row address signals $A_0$–$A_i$ into the address buffer ADB as row addresses in the memory array.

When the signal $\phi_{AR}$ has been delivered as stated above, the row address signals $a_0$, $\overline{a_0}$ . . . and $a_i$, $\overline{a_i}$ are supplied to the row decoder R-DCR. The row decoder R-DCR has internal nodes which correspond to the word lines of the memory array M-ARY one to one and which are brought into precharged states in advance. When the row address signals have been supplied, only the selected ones of the internal nodes in the row decoder R-DCR are left intact at the precharged level or the high level, and the remaining unselected internal nodes are brought into the low level. The control signal $\phi_X$ is provided after a predetermined delay time since the control signal $\phi_{AR}$ has been delivered. The delay time of the control signal $\phi_X$ relative to the control signal $\phi_{AR}$ is properly set in accordance with the operating characteristics of the row decoder R-DCR. When the control signal $\phi_X$ has been provided, signals which correspond to the signals at the respective internal nodes of the row decoder R-DCR are responsively supplied to the corresponding word lines of the memory array M-ARY. In case the row address signals are of (i+1) bits of $a_0$ to $a_i$, the number of the word lines in the memory array M-ARY is correspondingly set at $2^{i+1}$. Accordingly, that one of the $2^{i+1}$ word lines which corresponds to the row address signals of (+1) bits is brought into the selection level by the output of the row decoder R-DCR. Among the plurality of memory cells in the memory array M-ARY, only ones coupled to the selected word lines are selected. As a result, the data lines in the memory array M-ARY have their respective potentials determined in accordance with information previously stored in the selected memory cells coupled thereto. When a memory cell constructed of the 1-MOS transistor cell is employed, the capacitance value of a capacitor serving as information storage means within the memory cell is comparatively small as is well known, so that a potential change given from the selected memory cell to the corresponding data line is comparatively small.

Upon lapse of a predetermined delay time since the control signal $\phi_X$ has been delivered as described above, the sense amplifier control signal $\phi_{PA}$ is provided, and the operation of the sense amplifier SA is responsively started. The information signals applied to the respective data lines of the memory array M-ARY are amplified by the operation of the sense amplifier SA.

Upon lapse of a predetermined time since the row address signals $A_0$–$A_i$ have been supplied to the external terminals of the IC as described above, the column address signals $A_{i+1}$–$A_j$ are supplied to those external terminals.

At the timing at which the levels of the column address signals $A_{i+1}$–$A_j$ at the external terminals have been made appropriate, the $\overline{CAS}$ signal is brought into the low level. The reason why the $\overline{CAS}$ signal is delayed with respect to the column address signals $A_{i+1}$–$A_j$ in this manner, is to reliably introduce the address signals as column addresses in the memory array into the address buffer ADB as in the foregoing.

When the $\overline{CAS}$ signal has been brought from the high level to the low level, the signal $\phi_{AC}$ properly delayed is responsively provided, and the column address signals $A_{i+1}$–$A_j$ are latched in the address buffer ADB. In addition, the column address signals $a_{i+1}$, $\overline{a_{i+1}}$ . . . and $a_j$, $\overline{a_j}$ by the address buffer ADB are supplied to the column decoder C-DCR.

When the signal $\phi_Y$ further delayed from the signal $\phi_{AC}$ has been provided, a signal for selecting one of the plurality of data lines of the memory array M-ARY is responsively supplied from the column decoder C-DCR to the column switch circuit C-SW.

In this manner, one address in the memory array M-ARY is appointed by the row address and the column address.

Now, the reading and writing operations for the address set as described above will be explained with reference to FIG. 3A and FIG. 3B, respectively.

In the reading mode, the $\overline{WE}$ signal is held at the high level. This $\overline{WE}$ signal is so designed as to become the high level before the $\overline{CAS}$ signal becomes the low level.

When the signal $\phi_{OP}$ has been brought into the high level subsequently to the signal $\phi_Y$ being the CAS-group signal, the output amplifier OA is responsively activated. As a result, the information signal read out from the selected address of the memory array M-ARY is amplified by the output amplifier OA. The output of the output amplifier OA is delivered to the data output terminal $D_{out}$ through the data output buffer which is disposed if necessary. The reading operation is completed by bringing the $\overline{CAS}$ signal into the high level.

In the writing mode, the $\overline{WE}$ signal is held at the low level. The signal $\phi_{RW}$ is brought into the high level on the basis of the fact that the $\overline{WE}$ signal and the $\overline{CAS}$ signal are brought into the low level. When the signal $\phi_{RW}$ has been brought into the high level, the data input buffer DIB is thereby activated. As a result, data corresponding to the data supplied to the input data terminal $D_{in}$ is supplied to the memory array M-ARY through the input buffer DIB as well as the column switch circuit C-SW, and it is written into the memory cell to be selected within the memory array M-ARY.

In the writing mode, the inverted signal $\overline{\phi_{RW}}$ of the signal $\phi_{RW}$ is brought into the low level. The data output buffer is inactivated by this signal $\overline{\phi_{RW}}$. In the writing mode, accordingly, no data is read out.

The circuit of one embodiment shown in FIGS. 5A and 5B is principally constructed of N-channel IGFETs (Insulated-Gate Field Effect Transistors) represented by N-channel MOSFETs (Metal Oxide Semiconductor Field Effect Transistors). The memory cell (M-CELL) of 1 bit consists of an information storage capacitor $C_S$ and an address selecting MOSFET $Q_M$. The information of "1" and "0" which are retained by the memory cell correspond to the state in which the capacitor $C_S$ has charges and the state in which it has no charge, respectively.

The M-CELs are arrayed in the form of a matrix in large numbers. The drains of the address selecting MOSFETs $Q_M$ of the M-CELs arranged in the same rows are connected to data lines $DL_1$ etc. in common, while the gates of the MOSFETs $Q_M$ of the M-CELs arranged in the same columns are connected to word lines $WL_{1-1}$ etc. in common. Memory arrays $M-ARY_1$ and $M-ARY_2$ are constructed of a plurality of memory cells.

Although no special restriction is meant, data lines are constructed of the 128 sets of $DL_1-DL_{128}$ (not shown) and $\overline{DL_1}-\overline{DL_{128}}$ (not shown) and word lines are constructed of the 128 lines of $WL_{1-1}-WL_{1-64}$ and $WL_{2-1}-WL_{2-64}$ in a dynamic type MOS memory device having a memory capacity of 16 kbits.

Although not especially restricted, row decoders R-DCR$_1$ and R-DCR$_2$ are so constructed as to deliver common selection signals to a plurality of word lines. For example, in order to select the four word lines $WL_{1-1}-WL_{1-4}$, a unit decoder circuit which is constructed of MOSFETs $Q_1$ to $Q_5$ and which receive 4 bits of address signals $a_2-a_5$ is disposed within the R-DCR$_1$. The output of the single unit decoder circuit is supplied through MISFETs $Q_{10}-Q_{13}$ to a row switch R-SW$_{12}$ which is constructed of MOSFETs $Q_{24}-Q_{27}$. Likewise, the output of the R-DCR$_2$ is supplied to a row switch R-SW$_{22}$. The R-SW$_{12}$ or R-SW$_{22}$ is supplied with the signal $\phi_X$ through a row switch R-SW$_{11}$ or R-SW$_{21}$ which is controlled by a selection signal formed on the basis of the 3 bits of address signals $a_0$, $a_1$ and $a_6$ in the R-DCR$_1$ (R-DCR$_2$). Thus, one of the word lines $WL_{1-1}-WL_{1-64}$ and $WL_{2-1}-WL_{2-64}$ is selected at the timing of the signal $\phi_X$. In this manner, the word line selection of 1/128 is performed.

The word lines $WL_{1-1}-WL_{1-64}$ and $WL_{2-1}-WL_{2-64}$ are respectively provided with groups of latch circuits LACH$_1$ and LACH$_2$ as are described in detail in Japanese Laid-open patent specification No. 49-45649 or Japanese Laid-open patent specification No. 51-147224. Unit circuits constituting these groups of latch circuits have arrangements identical to one another, and one of them is constructed of MOSFETs $Q_{52}-Q_{54}$.

A unit circuit constituting the R-DCR$_1$ (the same applies to the R-DCR$_2$) is constructed of a precharging MOSFET $Q_1$, and driving MOSFETs $Q_2-Q_5$ which receive the address signals $a_2-a_5$. This unit circuit operates as a ratioless type logic gate circuit.

The output signal of the unit circuit is transmitted to the gates of MOSFETs $Q_{24}-Q_{27}$ etc. constituting the R-SW$_{12}$ and R-SW$_{11}$, through cutting MOSFETs $Q_{10}-Q_{23}$ whose gates are supplied with the supply voltage $V_{CC}$.

Read-out Signal Quantity

The read-out of the information from the M-CEL is performed by turning the MOSFET $Q_M$ "on" thereby to couple the $C_S$ to a common column data line DL and by subsequently sensing how the potential of the data line DL changes in accordance with the quantity of charges stored in the $C_S$. Supposing that the potential precharged in the stray capacitance $C_0$ of the data line DL is the supply voltage $V_{CC}$, and in case the information stored in the $C_S$ is "1" (potential substantially equal to $V_{CC}$), the potential ($V_{DL}$) "1" of the data line DL remains substantially the potential $V_{CC}$ at the addressing, that is, when the MOSFET $Q_M$ has been brought into the "on" state. On the other hand, in case the information is "0" (0 V), the ($V_{DL}$) "0" becomes $\{C_0 \cdot V_{CC} - C_S(V_w - V_{th})\}C_0$. Here, $V_w$ denotes the gate voltage of the MOSFET $Q_M$, and $V_{th}$ the threshold value of the MOSFET $Q_M$. Herein, the difference between the potential of the data line DL determine by the logic "1" of the memory cell and the potential of the data line DL determined by the logic "0" of the memory cell, in other words, the signal quantity $\Delta V_S$ to be detected becomes:

$$\Delta V_S = (V_{DL})"1" - (V_{DL})"0" = (V_w - V_{th}) \cdot C_S/C_0$$

Assuming that $V_w = V_{CC}$, the signal quantity $\Delta V_S$ becomes:

$$\Delta V_S = (V_{CC} - V_{th}) \cdot C_S/C_O$$

In a memory matrix of high packaging density and large capacity, memory cells are made small and a large number of memory cells are connected to a common data line. Therefore, $C_S \ll C_O$ holds, that is, $C_S/C_O$ becomes a very small value. Accordingly, the signal $\Delta V_S$ becomes a very slight signal.

Reference Signal for Reading

A dummy cell D-CEL is employed as reference for detecting such minute signal. The D-CEL is fabricated under the same manufacturing conditions and with the same design constants as those of the M-CEL, except that the capacitance value of a capacitor $C_D$ is made approximately half of the value of the $C_S$. Before addressing, the $C_D$ is charged to the ground potential (the other electrode is fixed to $V_{CC}$) by a MOSFET $Q_{D2}$. Accordingly, a signal variation $\Delta V_R$ which is given from the D-CEL to one column data line DL at the addressing is expressed by the following similarly to that ($\Delta V_S$) of the memory cell. $V_{DW}$ denotes the gate voltage of the MOSFET $Q_{D2}$, and $V_{th}'$ the threshold voltage of the MOSFET $Q_{D2}$.

$$\Delta V_R = (V_{DW} - V_{th}') \cdot C_{ds}/C_O$$

Assuming that $V_{DW} = V_{CC}$, the variation $\Delta V_R$ is expressed by the following:

$$\Delta V_R = (V_{CC} - V_{th}') \cdot C_{ds}/C_O$$

Since, as stated before, $C_{ds}$ is set at about half of $C_S$, $\Delta V_R$ is approximately equal to half of $\Delta V_S$. The information of "1" and "0" can accordingly be discriminated, depending upon whether the potential change which the memory cell exerts on the data line DL is smaller or larger than that ($\Delta V_R$) of the dummy cell.

Arrangement of Various Circuits $SA_1$ indicates a sense amplifier which enlarges the difference of such potential changes developing at the addressing, in a sense period that is determined by the timing signal (sense amplifier-control signal) $\phi_{PA}$ (the operation of the sense amplifier will be described later). The input and output nodes of the sense amplifier are coupled to a pair of complementary data lines $DL_1$ and $\overline{DL_1}$. The numbers of memory cells to be coupled to the data lines $DL_1$ and $\overline{DL_1}$ are made equal in order to enhance the detection accuracy by equalizing stray capacitances in the complementary data lines $DL_1$ and $\overline{DL_1}$. As shown in the figure, one dummy cell D-CEL is coupled to each of the lines $DL_1$ and $\overline{DL_1}$.

One of a pair of dummy word lines $DWL_{1-1}$ and $DWL_{1-2}$ is selected by the output of the $R$-$DCR_1$ or $R$-$DCR_2$ in order that when the memory cell coupled to one of the pair of complementary data lines $DL_1$ and $\overline{DL_1}$ has been selected, the dummy cell may be coupled to the other data line without fail.

Operation of Sense Amplifier

The sense amplifier $SA_1$ has a pair of cross-coupled MOSFETs $Q_{85}$-$Q_{88}$, and differentially amplifies the minute signals owing to their positive feedback operation. The positive feedback operation is started at the same time that a MOSFET $Q_{89}$ begins to be rendered conductive by the timing signal (sense amplifier-control signal) $\phi_{PA}$. Owing to the starting of the positive feedback operation, the higher data line potential ($V_H$) of the data line potentials determined by the memory cell or the dummy cell at the addressing in advance is lowered at a very low rate, and the lower data line potential ($V_L$) is lowered at a high rate. Thus, the difference between $V_H$ and $V_L$ is expanded. When, in this manner, $V_L$ has lowered to the threshold voltage $V_{Th}$ of the cross-coupled MOSFETs, the positive feedback operation ends. At the end of the positive feedback operation, $V_H$ remains a potential which is smaller than $V_{CC}$ and which is greater than $V_{Th}$, and $V_L$ finally reaches approximately 0 V.

The stored information of the memory cell substantially destroyed at the addressing is restored again (rewritten) by the potential $V_H$ or $V_L$ produced by the sensing operation of the sense amplifier.

Compensation of Logic "1" Level

However, when the data line potential $V_H$ has become lower than $V_{CC}$ in excess of a predetermined amount, the malfunction in which it is read as logic "0" takes place as the reading and rewriting are repeated several times. It is an active restore circuit that is disposed for preventing the malfunction. It functions to boost only the potential $V_H$ selectively to the potential $V_{CC}$ without exerting any influence on the potential $V_L$. $C_{B1}$ and $C_{B2}$ indicate MIS type varactors whose capacitances change depending upon applied voltages. Logically, it may be considered that the capacitor is formed by a higher voltage with reference to the threshold voltage $V_{Th}$ and not by a lower voltage.

Figure 4A:
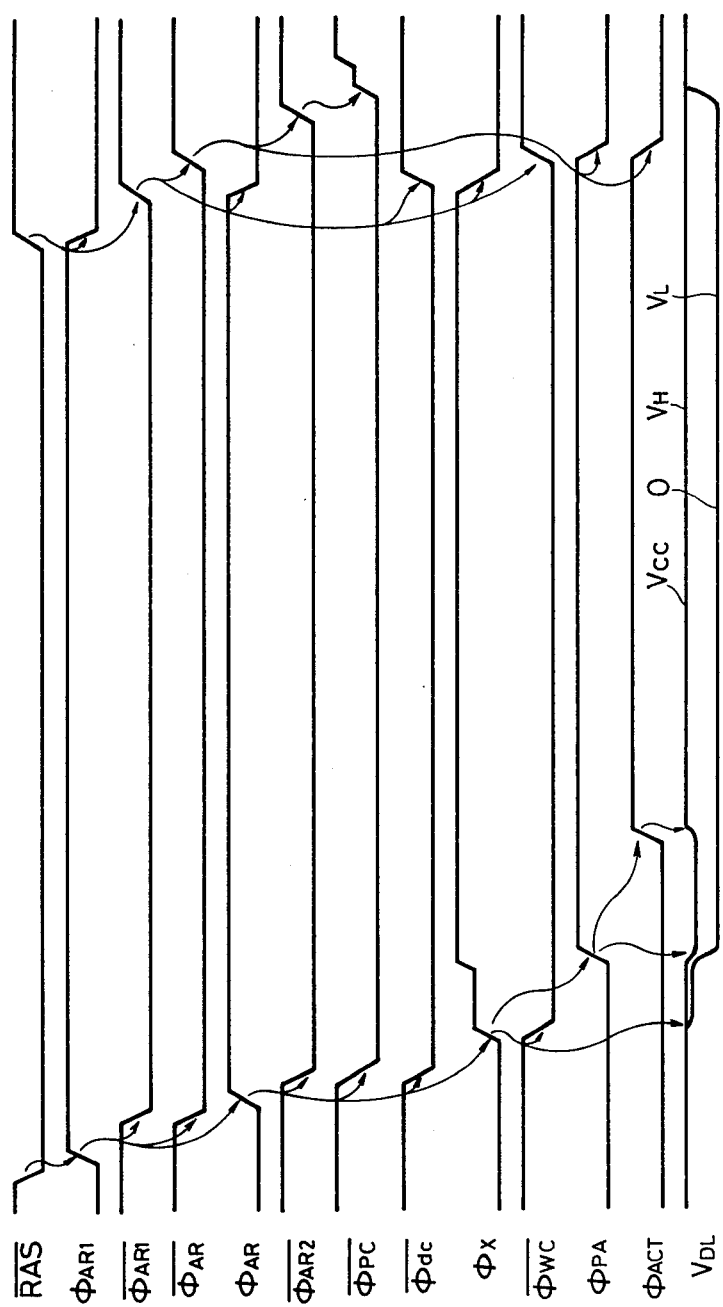
Figure 4B:
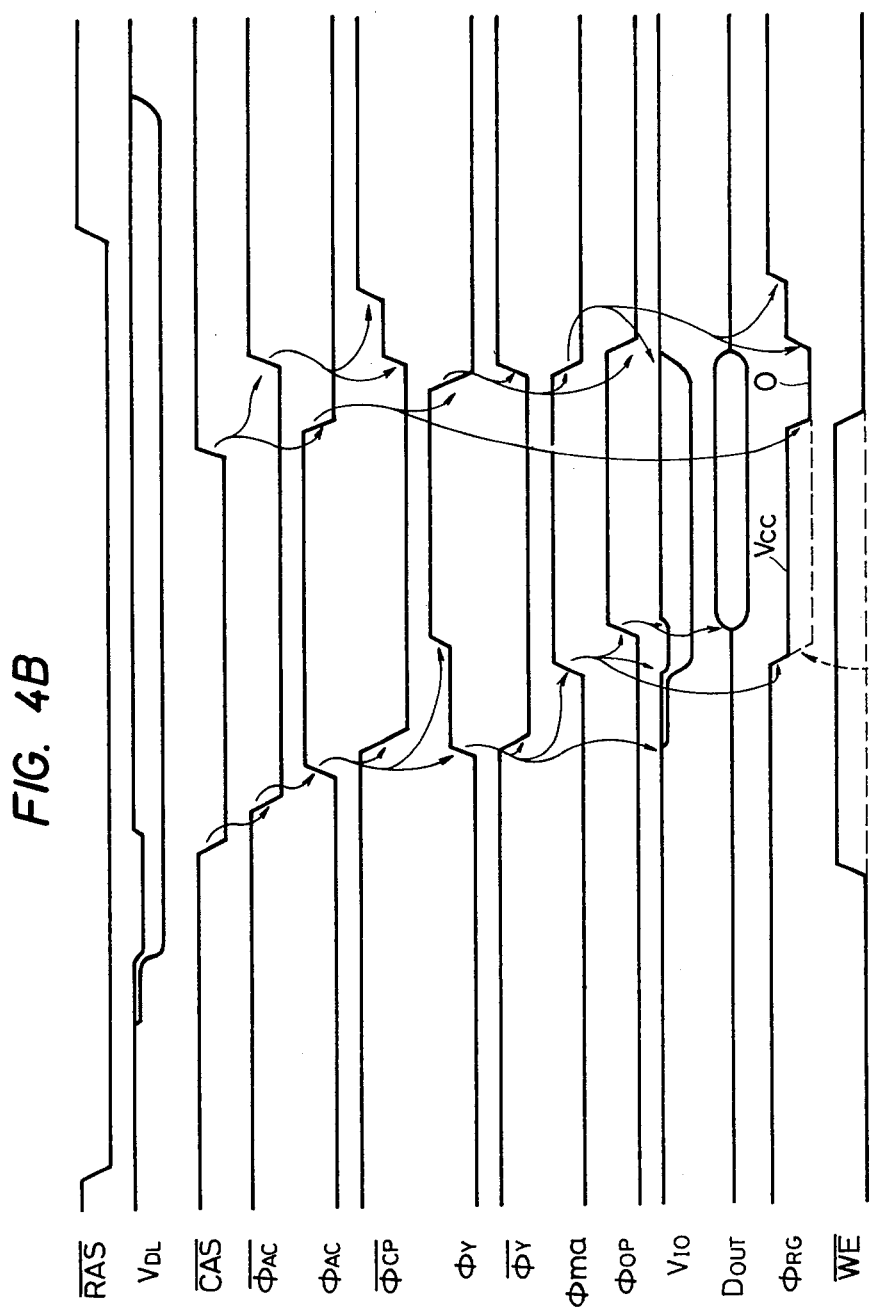

The active restore operation is as stated below. In the following description, for the sake of convenience, it is supposed that, at the addressing, the data line $DL_1$ is brought into the high level in accordance with the information "1" of the memory cell, while the data line $\overline{DL_1}$ is brought into the reference level by the dummy memory cell. Timing charts of various timing signals to be referred to in the following description are shown in FIGS. 4A and 4B.

The data lines $DL_1$ and $\overline{DL_1}$ and the varactors $CB_1$ and $CB_2$ are charged when MISFETs $Q_{79}$-$Q_{82}$ are held conductive by the high level of a data line precharging signal $\overline{\phi_{PC}}$.

Subsequently, when the sense amplifier $SA_1$ has been brought into the operative state by the sense amplifier-driving signal $\phi_{PA}$, the charges of the data line $\overline{DL_1}$ are thereby discharged through the MOSFET $Q_{88}$. Since, at this time, the data line $DL_1$ is at the high level, the MOSFET $Q_{86}$ is held in the "on" state. Therefore, the charges of the varactor $CB_2$ are also discharged. In effect, this varactor $CB_2$ no longer operates as a capacitor.

When, after the amplifying operation of the sense amplifier $SA_1$, a timing signal (active restore-control signal) $\phi_{acT}$ has been brought into the high level, the gate potential of the MOSFET $Q_{83}$ is responsively raised to be greater than the supply voltage $V_{CC}$. At this time, the gate potential of the MOSFET $Q_{84}$ is kept intact at the low level because the varactor $CB_2$ does not substantially operate as the bootstrap capacitance. In response to the gate potential of the MOSFET $Q_{83}$ raised above the supply voltage, the data line $DL_1$ is supplied with the supply voltage $V_{CC}$ through this MOSFET $Q_{83}$. That is, the potential of the data line $DL_1$ is restored to $V_{CC}$.

In this embodiment, in order to attain a fast operation, as shown in FIGS. 5A and 5B, MOSFETs $Q_{38}$-$Q_{49}$ whose gates are supplied with the timing signal $\overline{\phi_{WC}}$ are disposed between the ground potential terminal and the respective word lines $WL_{1-1}$-$WL_{1-64}$ and $WL_{2-1}$-$WL_{2-64}$ and dummy word lines $DWL_{1-1}$, $DWL_{1-2}$ ($DWL_{2-1}$, $DWL_{2-2}$... not shown). The "on" resistance of each of the MOSFETs $Q_{38}$-$Q_{49}$ is set to be sufficiently greater than the high level output impedance of the timing signal generator which forms the word line control signal $\phi_X$. Although no special restriction is meant, the "on" resistance of each of the MOSFETs $Q_{38}$-$Q_{49}$ should desirably be set at about 10 times greater than the output impedance of the above circuit in case, as in the circuit of this embodiment, about 100 word lines are constructed.

For the same purpose, MOSFETs $Q_{32}$-$Q_{35}$ are also disposed for common word lines with the R-SW$_{11}$ interposed therebetween.

Also on the data line selector circuit side, MOSFETs $Q_{77}$, $Q_{78}$ etc. which receive the timing signal $\overline{\phi_Y}$ are disposed between the ground potential terminal and the gates of data line selecting MOSFETs $Q_{75}$, $Q_{76}$ etc. Further, MOSFETs $Q_{69}$-$Q_{72}$ are disposed for common data line selecting lines with the C-SW$_1$ interposed therebetween.

Hereunder, the reason why these MOSFETs $Q_{38}$-$Q_{49}$ etc. are disposed will be described with reference to an operating principle diagram of FIG. 6 and an operating waveform diagram of FIG. 7.

Figure 6:
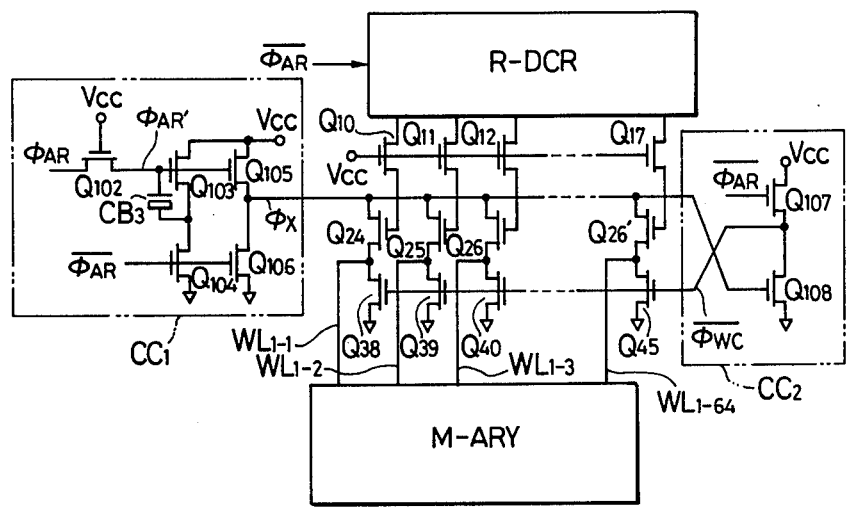
FIG. 6 is a diagram showing the operating principle of the embodiment of FIGS. 5A and 5B, FIGS. 4A and 4B are diagrams of operating waveforms in the circuit of FIGS. 5A and 5B.

In order to facilitate understanding, the R-SW$_{11}$ as in FIG. 5A is not illustrated in FIG. 6. In FIG. 6, accordingly, the signal $\phi_X$ is directly applied to MOSFETs $Q_{24}$-$Q_{26}'$.

Although not especially restricted, a timing signal generator CC$_1$ for forming the signal $\phi_X$ is constructed of MOSFETs $Q_{103}$ and $Q_{105}$ whose gates are supplied with the address buffer control signal $\phi_{AR}$ through a cutting MOSFET $Q_{102}$, MOSFETs $Q_{104}$ and $Q_{106}$ whose gates are supplied with the signal $\overline{\phi_{AR}}$ substantially delayed and inverted with respect to the above signal $\phi_{AR}$, and a bootstrap capacitance CB$_3$ which is disposed between the gate and source of the MOSFET $Q_{103}$.

An inverter circuit CC$_2$ for forming the timing signal $\overline{\phi_{WC}}$ to be supplied to the gates of the MOSFETs $Q_{38}$-$Q_{45}$ etc. is constructed of a driving MOSFET $Q_{108}$ whose gate receives the word line control signal $\phi_X$ formed by the timing generator circuit, and a precharging MOSFET $Q_{107}$ whose gate receives the inverted address buffer control signal $\overline{\phi_{AR}}$.

As shown in FIGS. 3A and 3B, the control signal $\phi_{AR}$ is held at the low level when the $\overline{RAS}$ signal is not received, that is, when the $\overline{RAS}$ signal is held at the high level. In contrast, the control signal $\overline{\phi_{AR}}$ is held at the high level.

At this time, the timing signal generator CC$_1$ has its MOSFET $Q_{106}$ held in the "on" state by the high level of the control signal $\overline{\phi_{AR}}$ and has its MOSFET $Q_{105}$ held in the "off" state by the low level of the control signal $\phi_{AR}$. Therefore, it provides the word line control signal $\phi_X$ of low level. The bootstrap capacitance CB$_3$ has its one terminal held at the low level of the control signal $\phi_{AR}$ through the cutting MOSFET $Q_{102}$ and has its other held at the low level by the MOSFET $Q_{104}$. Therefore, it is placed in the discharged state.

The inverter circuit CC$_2$ has its driving MOSFET $Q_{108}$ held in the "off" state by the low level of the word line control signal $\phi_X$ and has its MOSFET $Q_{107}$ held in the "on" state by the high level of the control signal $\overline{\phi_{AR}}$. Therefore, it provides the control signal $\overline{\phi_{WC}}$ of high level.

The respective word lines of the memory array M-ARY are held at the low level because the MOSFETs $Q_{38}$-$Q_{45}$ connected between them and the ground point of the circuitry are held in the "on" state by the high level of the control signal $\overline{\phi_{WC}}$.

The cutting MOSFET $Q_{102}$ maintains the "on" state when the potential of that one of the source and drain electrodes thereof which acts substantially as the source electrode is lower than the potential of the gate electrode thereof, that is, the threshold voltage thereof with respect to the supply potential $V_{CC}$ in case of the illustrated circuit.

Accordingly, when the signal $\phi_{AR}$ has subsequently risen to the high level, a signal $\phi_{AR}'$ corresponding thereto is supplied to the gates of the MOSFETs $Q_{103}$ and $Q_{105}$. As a result, the MOSFETs $Q_{103}$ and $Q_{105}$ are brought into the "on" states. In this case, the transconductance ratio between the MOSFETs $Q_{103}$ and $Q_{104}$ connected in series is properly set in advance, so that the potential of the common juncture of these MOSFETs $Q_{103}$ and $Q_{104}$ is held at the low level. Accordingly, the bootstrap capacitance CB$_3$ is precharged approximately to the high level of the signal $\phi_{AR}'$.

The signal $\overline{\phi_{AR}}$ falls with some delay with respect to the signal $\phi_{AR}$, whereby the MOSFETs $Q_{104}$ and $Q_{106}$ are brought into the "off" states. Owing to the bootstrap operation by the bootstrap capacitance CB$_3$, the signal $\phi_{AR}'$ is raised to a level higher than the supply voltage, for example, approximately 2 $V_{CC}$-$V_{th}$ (where $V_{CC}$ denotes the supply voltage, and $V_{th}$ the threshold voltage of the MOSFET $Q_{103}$). In this case, subject to the level of the signal $\phi_{AR}$ being close to the supply voltage $V_{CC}$, when the level of the signal $\phi_{AR}'$ has been further raised as stated above, the cutting MOSFET $Q_{102}$ is responsively brought into the "off" state. Accordingly, the charges stored in the bootstrap capacitance CB$_3$ are inhibited from being discharged during the boosting operation.

Figure 7:
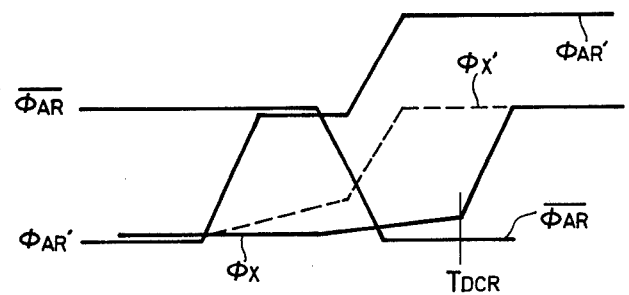
FIG. 7 is a diagram of operating waveforms in the circuit of FIG. 6.

In case the MOSFETs $Q_{38}$-$Q_{45}$ are removed from the circuit of FIG. 6, the word control signal $\phi_X$ to be delivered from the timing generator circuit becomes as shown by a broken line $\phi_X'$ in FIG. 7. It rises gradually in accordance with the transconductance ratio between the MOSFETs $Q_{105}$ and $Q_{106}$ at the same time that the MOSFET $Q_{105}$ has been brought into the "on" state, and it rises abruptly to the $V_{CC}$ level since the MOSFET $Q_{106}$ has been brought into the "off" state.

In this case, however, the word line control signal $\phi_X$ is brought into the high level at the timing at which the operation of the R-DCR controlled by the control signal $\overline{\phi_{AR}}$ has not fully ended. The word line control signal $\phi_X$ is brought into the high level at the timing at which MOSFETs to be brought into the "off" states among the MOSFETs $Q_{24}$-$Q_{26}'$ have not been sufficiently turned "off", with the result that the potential of the word lines to be rendered unselected is somewhat raised. Due to the undesirable rise of the word line potential, a plurality of memory cells coupled to one data line are selected at the same time. As a result, the information of the memory cells are destroyed.

In contrast, such undesirable circuit operation does not occur in the circuit shown in FIG. 6. More specifically, the selecting switch MOSFETs $Q_{24}$-$Q_{26}$ etc. are held in the "on" states till the completion of the operation of the R-DCR, and besides, the MOSFETs $Q_{38}$-$Q_{45}$ etc. held in the "on" states are arranged between the respective word lines and the ground point of the circuitry. Therefore, even when the MOSFET $Q_{105}$ has been brought into the "on" state as described above, the word line control signal $\phi_X$ can rise toward the high level only slightly. By way of example, even when the "on" resistance of each of the MOSFETs $Q_{38}$–$Q_{45}$ is set approximately 10 times greater than the "on" resistance of the MOSFET $Q_{105}$ as stated before, these MOSFETs $Q_{38}$–$Q_{45}$ are connected in the parallel form, and hence, their combined parallel resistance becomes sufficiently smaller than the "on" resistance of the MOSFET $Q_{105}$. For example, 100 MOSFETs which are disposed in correspondence with 100 word lines and which are connected in parallel have a combined parallel "on" resistance which is below 1/10 of the "on" resistance of the MOSFET $Q_{105}$. Accordingly, the level of the control signal $\phi_X$ can be suppressed to a low level below 1/10 of the $V_{CC}$ level. Owing to the suppression of the level of the control signal $\phi_X$, it is possible to prevent the potential of the plurality of word lines from being raised undesirably.

At a time $T_{DCR}$ after the completion of the operation of the R-DCR, one selecting switch MOSFET corresponding to the word line to be selected, for example, the MOSFET $Q_{24}$ is left "on", and all the other MOSFETs $Q_{25}$, $Q_{26}$ etc. are brought into the "off" states. The word line control signal $\phi_X$ is responsively supplied only to the MOSFET $Q_{38}$ through the MOSFET $Q_{24}$ held in the "on" state.

Since the "on" resistance of the MOSFET $Q_{38}$ is sufficiently greater than that of the MOSFET $Q_{105}$ as described above, the level of the word line control signal $\phi_X$ rises substantially to the $V_{CC}$ level even when the MOSFET $Q_{38}$ is in the "on" state at the time $T_{DCR}$.

Thus, the word line control signal $\phi_X$ can be automatically raised to the high level in conformity with the completion of the operation of the R-DCR.

When the word line control signal $\phi_X$ has risen to the high level at the time $T_{DCR}$, the inverter circuit $CC_2$ has its MOSFET $Q_{108}$ responsively brought into the "on" state. The output signal of the inverter circuit $CC_2$ having been held at the high level by the MOSFET $Q_{107}$ controlled by the control signal $\overline{\phi_{AR}}$ is brought into the low level by the MOSFET $Q_{108}$. All the MOSFETs $Q_{38}$–$Q_{45}$ are brought into the "off" states or high impedance states by the low level output of the inverter circuit $CC_2$. Thus, the word line control signal $\phi_X$ can be automatically raised to the $V_{CC}$ level in conformity with the completion of the operation of the R-DCR.

In case of controlling the rise of the control signal $\phi_X$ by means of the MOSFETs $Q_{38}$–$Q_{45}$ as described above, it is also possible to execute a desirable circuit operation as described hereunder.

Among the MOSFETs $Q_{24}$–$Q_{26}'$, the MOSFET brought into the "on" state by the output of the R-DCR has a channel layer induced in a channel forming region under its gate electrode. As a result, it has comparatively great capacitances (hereinbelow, termed "gate capacitances") between the gate electrode and the source and drain electrodes. In contrast, the remaining MOSFETs brought into the "off" states have no channel layer induced under their gate electrodes, and hence, they have only comparatively small and substantially negligible capacitances between the gate electrodes and the source and drain electrodes.

Since the control signal $\phi_X$ is raised to the high level substantially with the end of the operation of the R-DCR as described above, the aforementioned gate capacitances act, in effect, as bootstrap capacitances.

Assuming by way of example that only the MOSFET $Q_{24}$ is brought into the "on" state by the output of the R-DCR, the gate capacitances of the MOSFET are $Q_{24}$ are charged by the high level output signal of the R-DC before the rise of the control signal $\phi_X$ to the high level. Accordingly, when the control signal $\phi_X$ has been subsequently raised to the high level, the gate potential of the MOSFET $Q_{24}$ is raised to a potential which is higher than the level of the control signal $\phi_X$ by the charged voltage previously given to the gate capacitances. At this time, a cutting MOSFET $Q_{10}$ is brought into the "off" state by the same operation as in the cutting MOSFET $Q_{102}$, so that no discharging path for the gate capacitances is formed.

Owing to the rise of the gate potential based on, so to speak, the self-bootstrap effect as described above, the MOSFET $Q_{24}$ operates to transmit the control signal $\phi_X$ to the word line $WL_{1-1}$ without any substantial voltage loss in spite of the fact that it is of the enhancement mode.

The level of the selected word line $WL_{1-1}$ is raised to a value approximately equal to the supply voltage $V_{CC}$, in correspondence with the control signal $\phi_X$ which is raised to a value approximately equal to the supply voltage $V_{CC}$. Since the level of the selected word line is sufficiently raised, information charges of sufficiently great level are written or rewritten into the capacitance $C_S$ of the memory cell as shown in FIG. 5A.

In the other MOSFETs than the MOSFET $Q_{24}$ among the MOSFETs $Q_{24}$–$Q_{26}'$, substantially no gate capacitance is constructed as stated above. Accordingly, the gate potentials of these MOSFETs are not raised even when the control signal $\phi_X$ has been raised to the high level.

In case the control signal $\phi_X$ is changed as indicated by the broken line in FIG. 7, the gate capacitances of the MOSFET $Q_{24}$ are not sufficiently charged at the time when this control signal $\phi_X$ begins to rise. It is therefore difficult to sufficiently raise the potential of the selected word line. At this time, the higher potential of the source of the switch MOSFET $Q_M$ in the memory cell is limited by the gate potential thereof, that is, the potential of the selected word line and the threshold voltage thereof. Accordingly, even when the data line has been sufficiently brought into the high level, information charges to be written or rewritten into the memory capacitance $C_S$ become a comparatively small value.

According to the above embodiment, the word line control signal $\phi_X$ need not be delayed for a predetermined time after the end of the operation of the R-DCR as does in the prior art, so that the operation of the circuit can be rendered fast. Moreover, the word line control signal $\phi_X$ can be raised to the high level whilst following up the fluctuations of the operation completion times of the ADB and the R-DCR as are ascribable to the dispersion of elements, the temperature changes and the supply voltage fluctuations. Therefore, no malfunction occurs in the circuit.

These are quite similar as to the data line selecting operation.

Accordingly, in case this invention is applied to both the word line selector circuit and the data line selector circuit, the timings of both the selecting operations can be quickened, so that a still faster memory access cycle can be realized.

This invention is not restricted to the foregoing embodiments, but the signal for turning "off" the MOSFETs $Q_{38}$–$Q_{45}$ etc. may well be a predetermined delayed timing signal, otherwise than being formed by the MOSFET $Q_{108}$ in the latch form as described above.

Further, the MOSFETs $Q_{38}$–$Q_{45}$ etc. may well be mere resistance means. Even with fixed resistance means, a similar operation can be effected in such a way that the combined parallel resistance before the completion of the operation of the R-DCR as stated above is made sufficiently smaller than the output impedance of the timing generator circuit and that the value of the resistance belonging to the selected word line after the completion of the operation is made sufficiently greater.

While the inverter circuit $CC_2$ shown in FIG. 6 constructs a substantially ratioless circuit in order to render the power consumption of the circuit low, it may well be replaced with a ratio circuit in which, for example, the MOSFET $Q_{107}$ has its gate connected to its drain.

According to this invention, as the ratio between the combined parallel resistance and the resistance of the single resistor is greater, the effect increases more. Therefore, the invention is particularly useful for a dynamic type MOS memory device of large capacity.

This invention can be extensively utilized for dynamic type MOS memory devices in which the word line and/or data line selecting operation is performed in accordance with predetermined timing signals.

What is claimed is:

1. A dynamic type MOS memory device comprising:
    a plurality of gate lines and a plurality of selecting switch MOSFETs which are disposed in correspondence with the respective gate lines:
    a control circuit for controlling said plurality of selecting switch MOSFETs;
    a plurality of resistance means which are disposed between the respective gate lines and the ground potential and each of which has a control terminal; and
    an inverter circuit which receives timing signals to be applied to input side electrodes of the respective selecting switch MOSFETs and which delivers control signals to the control terminals;
    wherein said timing signals are brought into a supply voltage level substantially in synchronism with completion of an operation of said control circuit.

2. A dynamic type MOS memory device according to claim 1, wherein said gate lines are gate lines corresponding to word lines for selecting memory cells and data lines for selecting the memory cells.

3. A dynamic type MOS memory device according to claim 2, further comprising:
    a latch circuit which is disposed in correspondence with said each word line and which makes the non-selected word line a low impedance and makes the selected word line a high impedance by detecting a signal appearing thereon.

* * * * *